United States Patent [19]
Mohr, III et al.

[11] Patent Number: 5,923,115
[45] Date of Patent: Jul. 13, 1999

[54] LOW MASS IN THE ACOUSTIC PATH FLEXIBLE CIRCUIT INTERCONNECT AND METHOD OF MANUFACTURE THEREOF

[75] Inventors: John P. Mohr, III, San Jose; John William Sliwa, Jr., Los Altos; Vaughn R. Marian, Saratoga, all of Calif.

[73] Assignee: Acuson Corporation, Mountain View, Calif.

[21] Appl. No.: 08/753,318

[22] Filed: Nov. 22, 1996

[51] Int. Cl.$^6$ .................................................. H01L 41/08
[52] U.S. Cl. ........................................... 310/334; 310/365
[58] Field of Search ................................... 310/334–336, 310/363–366

[56] References Cited

U.S. PATENT DOCUMENTS

| | | | |
|---|---|---|---|
| 3,952,387 | 4/1976 | Ilinuma et al. | 29/25.35 |
| 4,217,684 | 8/1980 | Brisken et al. | 29/25.35 |
| 4,404,489 | 9/1983 | Larson, III et al. | 310/334 |
| 4,467,237 | 8/1984 | Piaget et al. | 310/334 |
| 4,479,069 | 10/1984 | Miller | 310/334 |
| 4,651,310 | 3/1987 | Kaneko et al. | 310/334 X |
| 4,783,888 | 11/1988 | Fujii et al. | 310/334 X |
| 4,962,332 | 10/1990 | Rokurohta et al. | 73/632 |
| 4,975,892 | 12/1990 | Defranould | 310/365 X |
| 5,126,616 | 6/1992 | Gorton et al. | 310/334 |
| 5,275,167 | 1/1994 | Killam | 128/622.03 |
| 5,329,202 | 7/1994 | Garlick et al. | 310/334 |
| 5,423,220 | 6/1995 | Finsterwald et al. | 73/642 |

*Primary Examiner*—Mark O. Budd
*Attorney, Agent, or Firm*—Brinks Hofer Gilson & Lione

[57] ABSTRACT

A low mass in the acoustic path flex circuit that has a thin metal layer in the acoustic path area and thicker electrical traces. The low mass flex circuit allows for mass termination of the signal and ground traces with the electrodes of the piezoelectric piezoelements. Regions that are to be diced are reduced in thickness to decrease the loading on the dicing blade during fabrication.

17 Claims, 8 Drawing Sheets

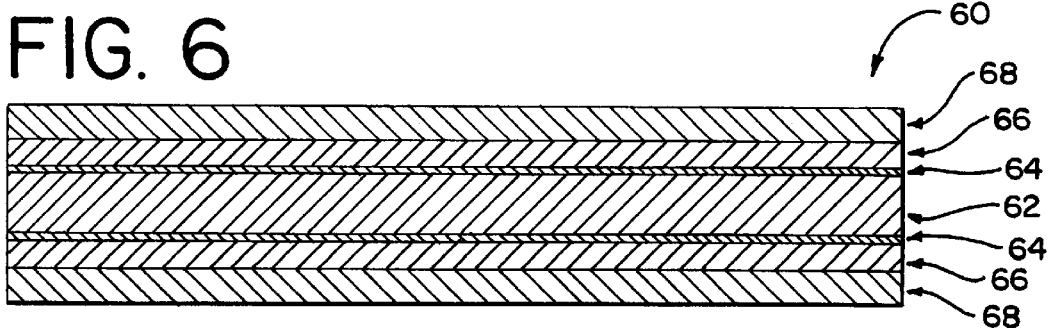
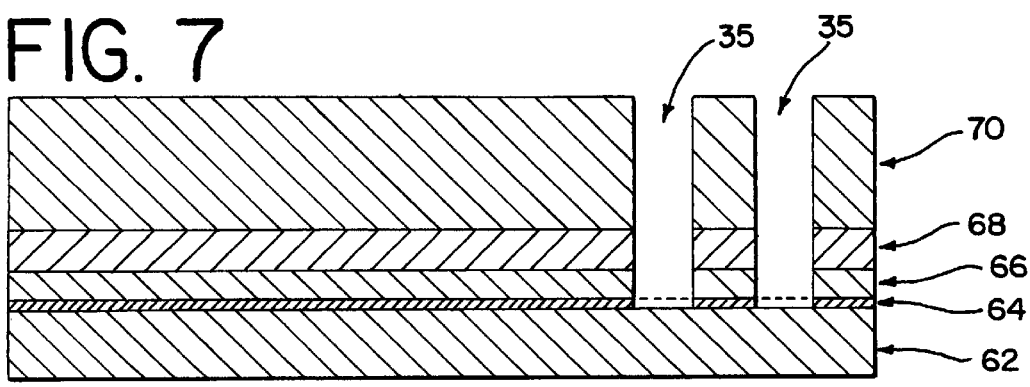
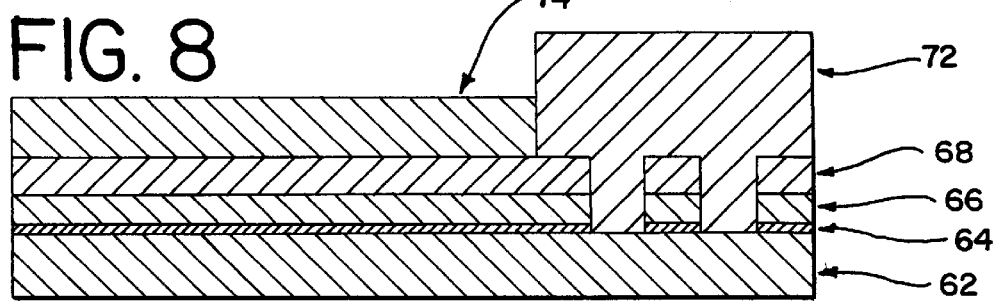
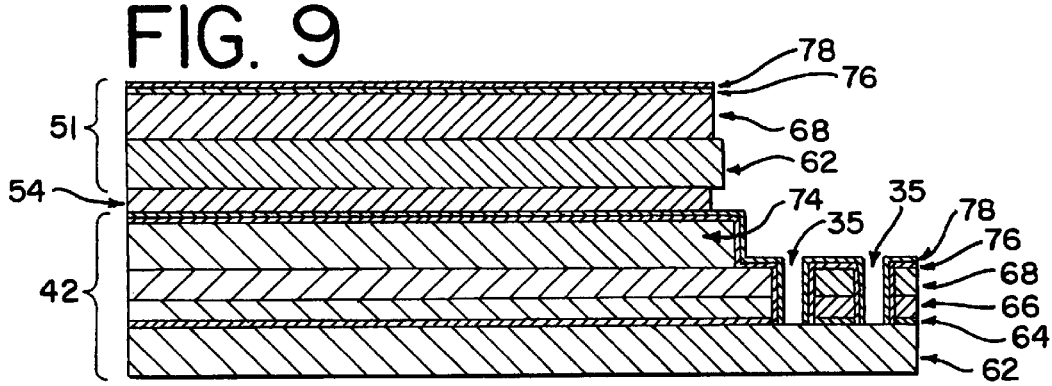

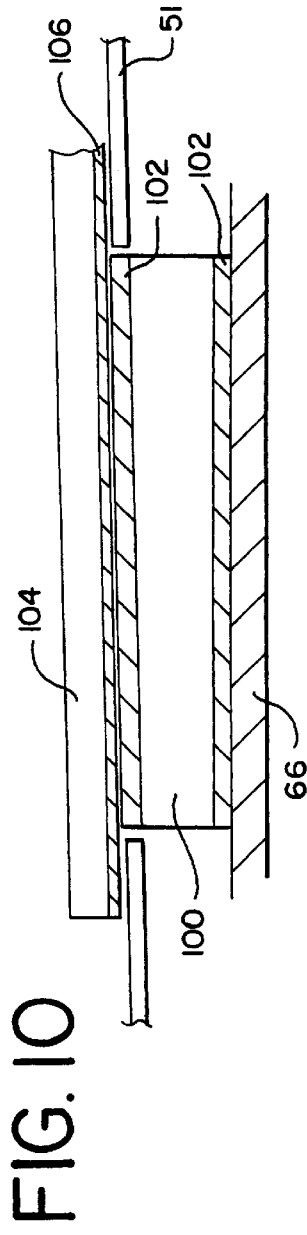
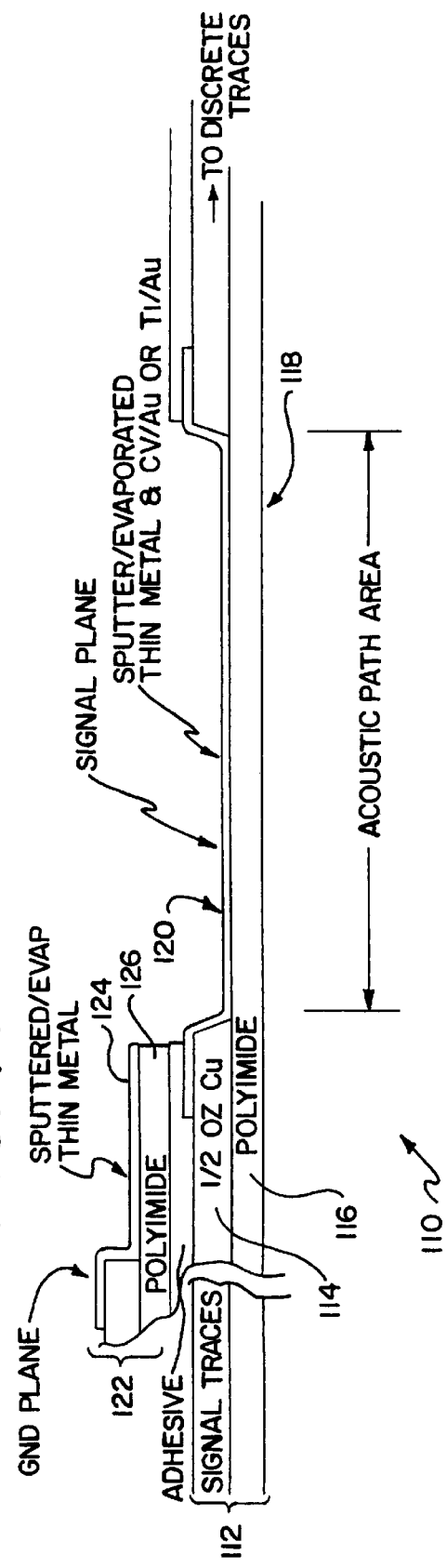

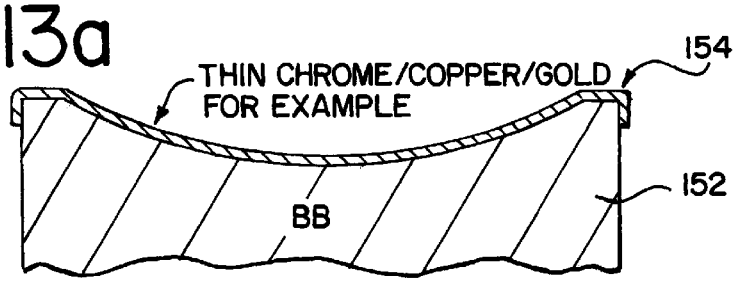
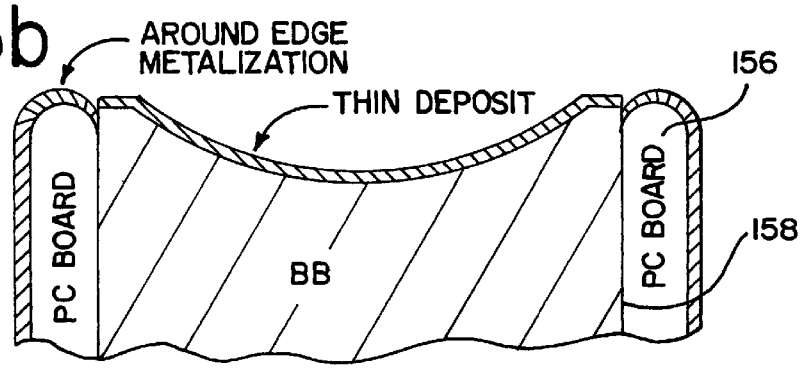
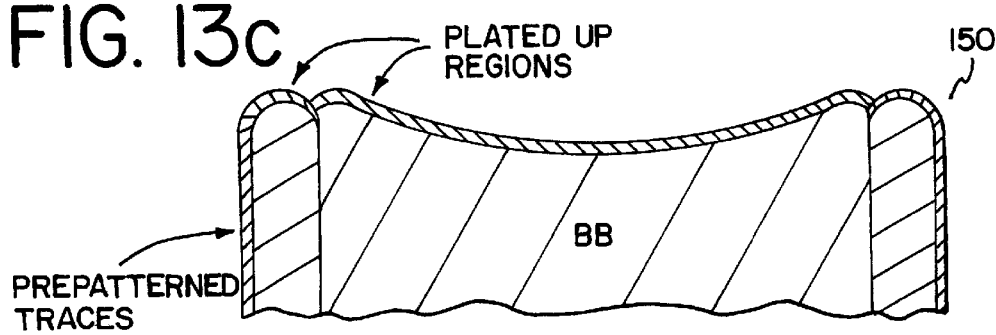
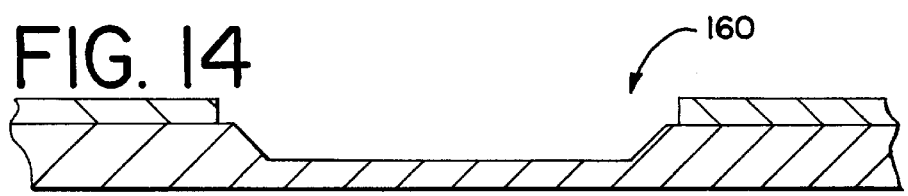
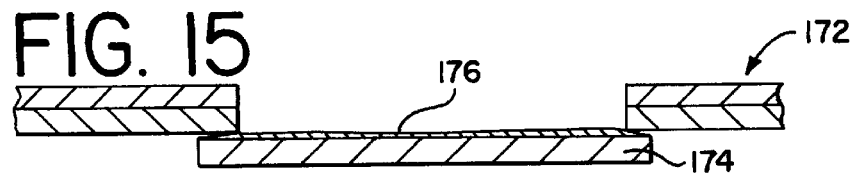

LOW MASS IN THE ACOUSTIC PATH FLEXIBLE CIRCUIT INTERCONNECT AND METHOD OF MANUFACTURE THEREOF

FIELD OF THE INVENTION

The present invention is directed to a low mass in the acoustic path flexible circuit interconnect for electrically coupling an array of transducer piezoelements to a source of excitation energy and receiver and more particularly to a low mass flexible circuit in which the impact of the connection on acoustic performance is minimized.

BACKGROUND OF THE INVENTION

There are several well known ways of coupling transducer piezoelements to the transmit and receive circuits of an ultrasound system. One way is to utilize a monolithic sheet or patterned flexible circuits. For transducer architectures utilizing monolithic sheet or patterned flexible circuits, the circuits are generally constructed from metal foils, typically copper foils, that are rolled, and annealed or electrodeposited on a drum, peeled off and either bonded to a polymer film carrier or have a polymer film directly applied to a surface. These foils are typically available in various thicknesses ranging from about 0.6 mils to about 5.25 mils ($\frac{3}{8}$ ounce/ft$^2$ to 1 ounce/ft$^2$ weight foils). The thickness of the foils may be increased by about 0.04 mils to 0.1 mils with the addition of a diffusion barrier layer, usually nickel, and a corrosion resistant layer, usually gold. The thinnest commonly available metallic material for flexible circuits utilize 0.5 ounce/ft$^2$ foil having a thickness ranging from about 0.7 to about 0.9 mils. These metal foils have a conductive layer of uniform thickness and the interconnect circuits are fabricated by the subtractive etching a circuit design in the uniform conductive layer that extends across the surface of a polymer film. The presence of thick metal, i.e., about ½ ounce weight, in the acoustic path limits the performance of the device due to mass-loading. U.S. Pat. No. 4,404,489 (Larsen et al.) describes such a prior art flex circuit and method of fabrication.

Since the metal layer has about the same acoustic impedance as the transducer piezoelement formed of piezoelectric material, typically lead zirconate titanate (PZT), the thickness of the transducer piezoelement must be sacrificed for foil thickness to achieve a particular operational frequency. This results in a thinner layer of piezoelectric material which is more difficult to fabricate and handle. In addition, to maintain efficient piezoelement performance, certain width to thickness ratios need to be employed. As the piezoelectric material gets thinner the piezoelement width must be proportionally narrowed. This lowers the frequency ceiling for a producible device with respect to the limits of piezoelement definition, i.e., dicing and material strength of the piezoelement structure. In addition, the prior art methods are limited to a single layer of copper of uniform thickness in the trace areas as well as the active acoustic path and interconnect areas. These limitations are imposed by the requirements for low resistance signal pathways and the associated inability to remove a limited and uniform amount of material in the acoustic pathway.

It is thus desirable, especially for high frequency transducers, to minimize the metal thickness in the flex circuit making contact with the piezoelectric material. This requirement will be referred to as a low mass connection in the acoustic region.

In methods where transducer piezoelements are disposed on or laminated to a monolithic or patterned sheet using adhesives it is difficult to obtain sufficient bond strength between the foil and the PZT that will survive the fabrication process, particularly piezoelement definition. Mechanical roughening, such as abrasion of the bonding surface with an emery cloth or sand paper can improve the adhesive bond, but may compromise the integrity of the electrical path. Foil treatments, such as electrodeposition of metal nodules on the surface of the foil also improve adhesive bond strength, but may increase the effective bond line thickness between the foil and the transducer piezoelements.

It is thus desirable to improve the adhesive bonding quality of the transducer element to the flex circuit without compromising the electrical path or roughening the surfaces to the extent that increased thickness of the epoxy bond lines result.

In transducer architectures where a low mass connection is desired several approaches have been used. One method involves the hand soldering of wires or traces directly to the electrode of the transducer piezoelements. Another method, the Tape Automated Bonding (TAB) method, commonly used in the wafer industry, can be applied to transducer piezoelement connections. In the TAB method, a TAB jumper is soldered or welded directly to the transducer piezoelement or an intermediate connector using automated tooling. Still another method, ultrasonic or thermocompression wire bonding can be used to attach a low mass lead directly to the transducer piezoelement and then to an intermediate connector.

In methods involving soldering or bonding traces directly to the transducer piezoelements, the connections are generally made one at a time thus making assembly of the transducer complicated, cumbersome, and time consuming. In addition, the connection point of the trace to the piezoelement has a very small area which does not provide a redundant path for the transducer piezoelement electrode. Thus, if the coupling of the trace to the piezoelement is compromised or if there is a discontinuity in the PZT electrode outside of the connection point area, the piezoelement becomes electrically isolated either totally or partially and may be rendered unusable. Moreover, in direct termination methods where mass and gang termination is an available option, such as with TAB, significant heat and/or mechanical damage can result from the termination process. Also, a separate provision must be made for connecting the transducer piezoelements to ground. Typically, such provisions involve soldering a foil or applying a conductive epoxy bead to the ground electrode of the PZT.

Another disadvantage of these methods is that they may not permit the use of a prefabricated acoustic backer during the construction process of the transducer array because the wirebonds or leads are on the backside of the acoustic path and thus the acoustic backer must be applied in a liquid phase after the bonds have been made.

It is thus desirable to provide a flexible circuit that has low mass in the acoustic region so as to minimize deleterious mass loading effect on the acoustic performance and assist in maintaining structural integrity of the transducer piezoelement through the fabrication processes. It is also desirable to provide a flexible circuit that maintains electrical continuity across the entire piezoelement electrode area, providing redundancy to the PZT electrode and having low resistance over the entire flex circuit trace length. It is also desirable to provide a simple connection method to allow easy mass termination during the fabrication process. It is also desirable to provide a similar connection method for the ground path. It is also desirable to effectively minimize electrical crosstalk between adjacent signal traces. Finally, it is desirable to provide a flexible circuit having an improved adhesive bond strength between the flexible circuit and a bonding adhesive. Furthermore, it is desirable to provide a flexible circuit that acts as a heat sink to carry heat away from the piezoelements.

SUMMARY OF THE INVENTION

According to a first aspect of the present invention there is provided a low mass in the acoustic region flexible circuit for an ultrasound transducer. The flexible circuit includes conductive material having, an acoustic path area and at least one trace area, wherein the at least one trace area is routed to the acoustic path area and the thickness of the conductive material in the acoustic path area is less than the thickness of the conductive material in the at least one trace area.

According to a second aspect of the present invention there is provided a method of making a low mass flexible circuit interconnect for an ultrasound transducer assembly. The method includes the steps of forming a signal path layer including the steps of providing a base film having a thin conductive material on one surface of the film, defining a circuit geometry on the surface of the film having the conductive layer, defining a center pad area by masking an area on the surface of the film having the conductive layer, depositing a layer of metal over the surface of the film having the conductive layer so that the conductive layer away from the center pad area is plated up so that the thickness of the conductive layer in the center pad area is thinner than the thickness of the conductive layer away from the center pad area, and removing the mask from the center pad area.

According to a third aspect of the present invention there is provided a low mass in the acoustic region flexible circuit for an ultrasound transducer system. The flexible circuit includes a signal path layer having a center pad area and electrical trace areas leading away from the center pad area wherein the thickness of the center pad area is thinner than the thickness of the trace areas, and a ground path layer coupled to the signal path layer, the ground path layer having a base film in contact with the signal path layer and a conductive material disposed on the base film, the ground path layer having an opening over the center pad area of the signal path layer.

According to a fourth aspect of the present invention there is provided a method of making a low mass in the acoustic region flexible circuit interconnect for an ultrasound transducer assembly. The method includes the steps of providing a base film having a thin conductive material disposed on a surface of the base film, where the conductive material is removed from a center pad area and signal trace areas are formed in the conductive material leading away from the center pad area, and depositing a thin conductive layer over the center pad area and over a portion of the conductive material away from the center pad area wherein the thickness of the conductive material in the center pad area is less than the thickness of the signal trace areas away from the center pad area.

According to a fifth aspect of the present invention there is provided a low mass in the acoustic region flexible circuit interconnect for an ultrasound transducer including a base film having a first thin conductive material disposed on a portion of one surface thereof and no conductive material over a center pad region, a second thin layer of conductive material over the center pad region and the first conductive material around the center pad region, signal trace areas formed in the first and second conductive materials extending away from the center pad region, and a layer of adhesive over the first conductive material and second conductive material extending over the first conductive material.

According to a sixth aspect of the present invention there is provided a method of making a low mass flexible circuit interconnect for use in an ultrasound transducer. The method includes the steps of providing a backer; depositing a thin conductive film on a surface of the backer, the thin conductive film having a first thickness; providing a signal path layer having a plurality of signal leads extending in a parallel relation, the signal leads having a second thickness wherein the second thickness is greater than the first thickness; and coupling the signal path layer to the thin conductive film on the backer.

The invention itself, together with further objects and attendant advantages, will be best understood by reference to the following detailed description, taken in conjunction with the accompanying drawings.

BRIEF DESCRIPTION OF THE DRAWINGS

FIG. 6 is a cross-section of the base material for the flex circuit interconnect according to a preferred embodiment of the present invention.

FIG. 7 is a cross-sectional view of a portion of the flex circuit during the development process.

FIG. 8 is a cross-sectional view of a portion of the flex circuit during the development process.

FIG. 9 is a cross-sectional view of a portion of the flex circuit according to a preferred embodiment of the present invention.

FIG. 10 is a cross-sectional view of a piezoelectric slab and a portion of the flex circuit according to a preferred embodiment of the present invention.

FIG. 11 is a cross-sectional view of a flex circuit according to a preferred embodiment of the present invention.

FIGS. 13a–c are cross-sectional views of the construction of a flex circuit according to a preferred embodiment of the present invention.

FIG. 14 is a cross-sectional view of a flex circuit according to a preferred embodiment of the present invention.

FIG. 15 is a cross-sectional view of a flex circuit according to a preferred embodiment of the present invention.

DETAILED DESCRIPTION OF THE PRESENTLY PREFERRED EMBODIMENTS

Figure 1:
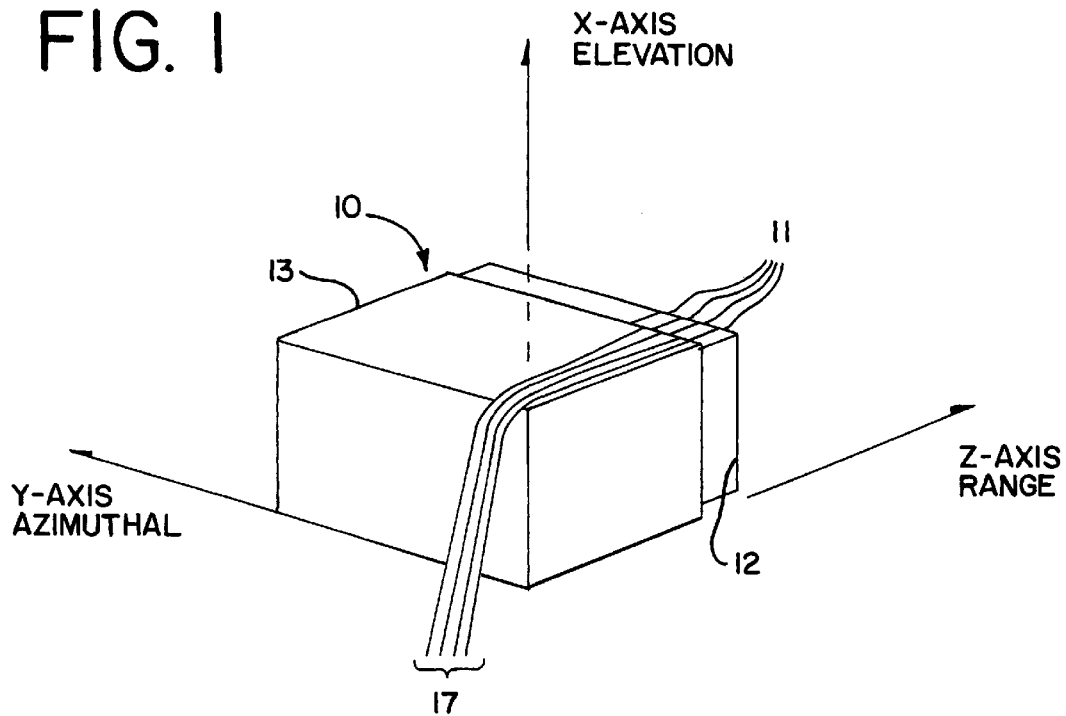
FIG. 1 is a perspective view of a transducer assembly.

FIG. 1 is a perspective view of a transducer assembly 10. The assembly 10 includes an array of transducer piezoelements 11 disposed on an acoustic backing block 13. Typically there are one hundred twenty-eight piezoelements in the azimuthal direction, however, the array may consist of any number of transducer piezoelements 11 each arranged in any desired geometrical configuration. Adapted from radar terminology, the x, y, and z directions are referred to as the azimuthal, elevation, and range directions respectively as indicated. Electrical traces 17 of a flex circuit (not shown in its entirety) couple the transducer piezoelements 11 to transmit and receive circuitry (not shown). Each transducer piezoelement 11 is preferably formed of piezoelectric material and has an electrode on its top and bottom surfaces. Preferably the electrodes on the bottom surface of the transducer piezoelements 11 are next to the backing block 13 and are coupled to signal traces 17 which provide the excitation signal to the transducer piezoelements 11. The electrodes on the top surface of the transducer piezoelements 11 are coupled to ground traces or a ground plane (not shown).

Of course, it should be realized that none of the figures are drawn to scale.

Figure 2:
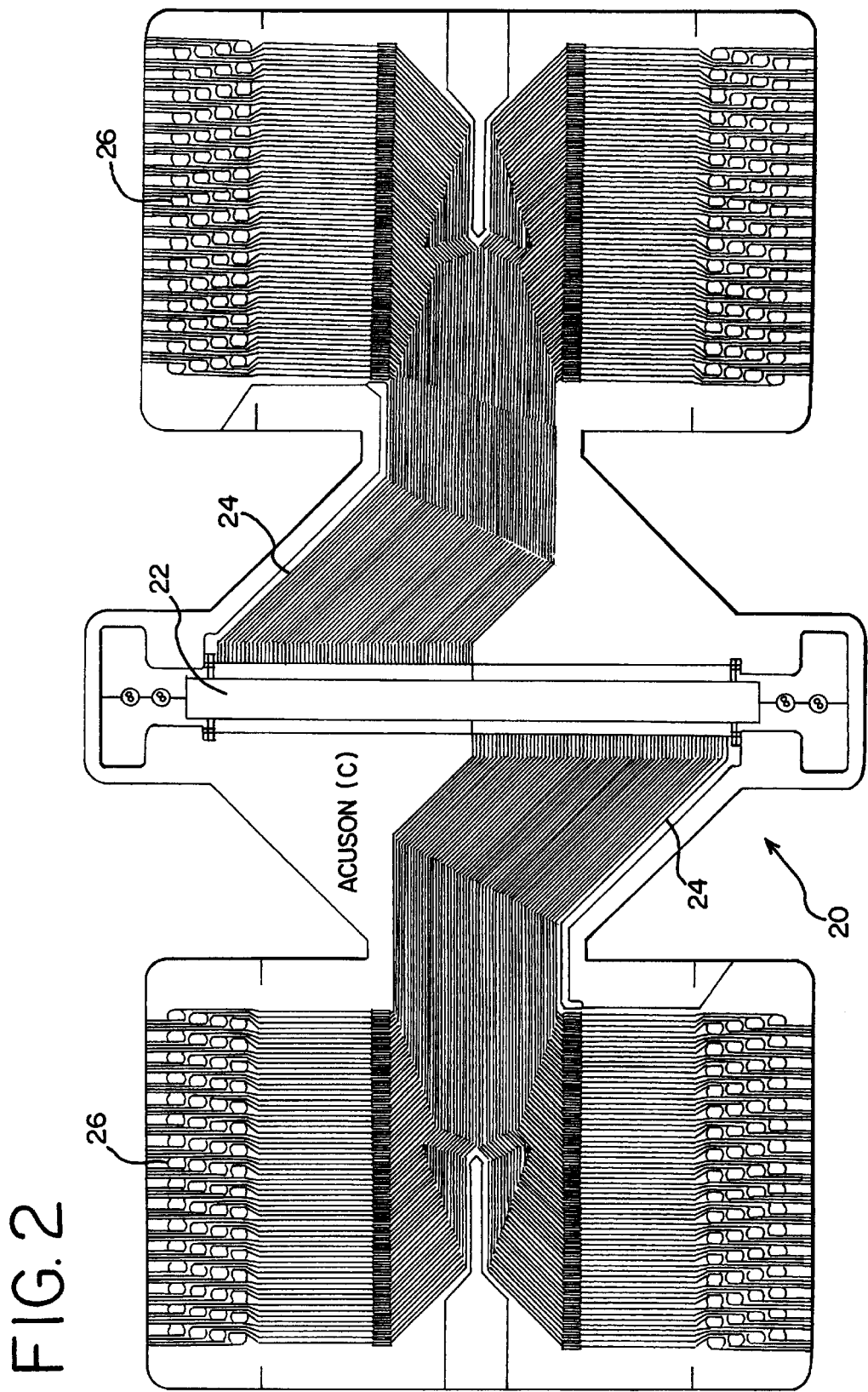
FIG. 2 is a top view of a portion of a low mass flex circuit according to a preferred embodiment of the present invention.
Figure 3:
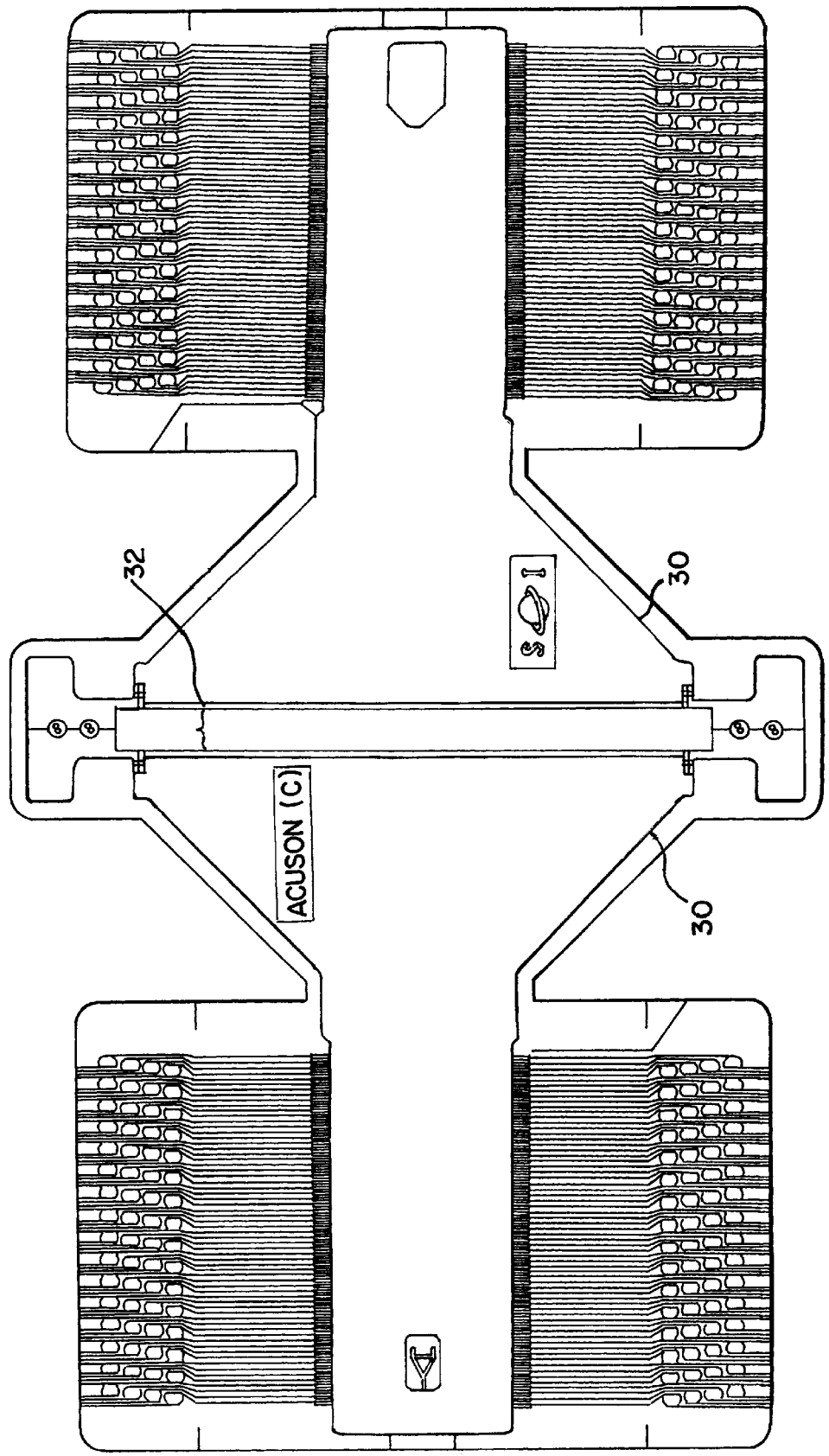
FIG. 3 is a top view of the low mass flex circuit shown in FIG. 2 with the ground plane assembled according to a preferred embodiment of the present invention.

FIG. 2 is a top view of a portion of a low mass flex circuit according to a preferred embodiment of the present invention. FIG. 3 is a top view of the low mass flexible circuit shown in FIG. 2 with the ground plane assembled according to a preferred embodiment of the present invention. Referring to both FIGS. 2 and 3, in a preferred embodiment, the low mass in the acoustic region flexible circuit is formed by two primary components, a signal path layer or signal plane 20 shown in FIG. 2 and a ground path layer or ground plane 30 shown in FIG. 3 disposed over the signal plane 20. The ground plane 30 and signal plane 20 are combined into one integrated unit preferably by bonding the ground plane 30 to the signal plane 20 as will be described hereinafter.

The signal plane 20 includes a low mass center pad area 22 which is in the acoustic region of the flex circuit and a plurality of discrete signal traces 24 extending away from both sides of the center pad area 22 and terminating in test pad areas 26. In a preferred embodiment of the invention, the center pad area 22 is a continuous sheet of metal on which a slab of piezoelectric material, which will be diced to form transducer piezoelements, (not shown) will be disposed as described in detail hereinafter. In another preferred embodiment, the individual signal traces continue in the center pad area to define individual transducer elements before the slab of piezoelectric material has been diced. As previously described, each transducer piezoelement will have its own electrode on its bottom and top surfaces. In either embodiment the center pad area 22 after it has been diced to define individual transducer elements if it is initially one continuous sheet of metal or the signal traces that extend through the center pad area 22 are coextensive with the electrode on the bottom surface of each transducer element thereby forming a redundant electrical path for each transducer element which has several advantages that will be discussed hereinafter.

Unlike the signal plane 20 which has a plurality of discrete signal traces 24, the ground plane 30 does not. The ground plane is a metallized layer that has an opening 32 that will be aligned over the center pad area 22 of the signal plane when the ground plane 30 is assembled with the signal plane 20.

In a preferred embodiment the mating surface of the center pad area 22 of the signal plane 20 upon which the slab of piezoelectric material will be disposed is patterned with very small features for improving the strength of the bond between the mating surface of the center pad and an epoxy which will be used to bond the slab of piezoelectric material to the center pad.

Figure 4:
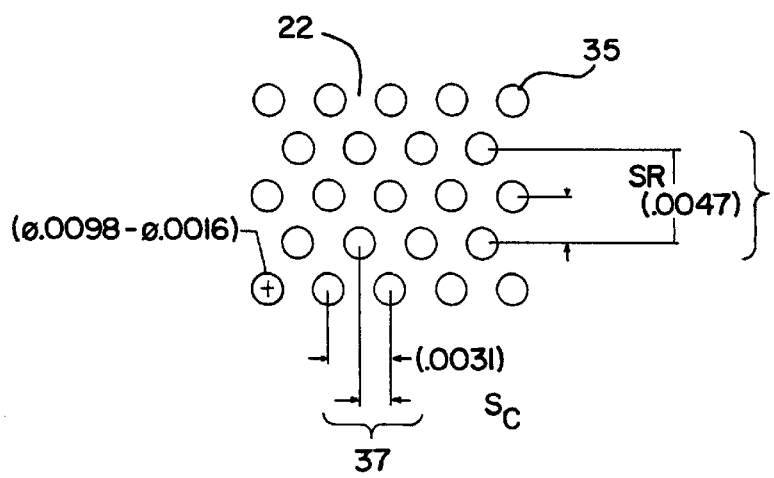
FIG. 4 is a highly magnified top view of a small portion of the center pad area where the PZT joins the flex circuit.

FIG. 4 is a highly magnified top view of a small portion of the center pad area 22 on which the slab of piezoelectric material will be disposed. Holes 35 having a diameter of about 25 $\mu$m to about 40 $\mu$m are patterned in the surface of the center pad area 22. More particularly, the metal is etched away or otherwise lacking due to the photolithography and chemical etching trace definition process which will be described hereinafter. The holes are arranged preferably in rows 36 having a row spacing $S_r$ of about 24 $\mu$m to about 120 $\mu$m and columns 37 having a column spacing $S_c$ of about 40 $\mu$m to 75 $\mu$m. The holes improve the adhesive bond of epoxy to the center pad area by increasing the surface area, exposing materials that form stronger adhesive bonds and providing pockets in which plugs of epoxy are formed by the bonding epoxy thereby improving the shear strength of the joint. Moreover, where the metal is etched away during the defining process of the holes, a polyimide base film is exposed providing sites where polymer to epoxy bonds are formed. Of course, many other hole sizes and row spacings can be used and the present invention is not limited to the particular preferred embodiments illustrated. Additionally, patterned features other than holes can be utilized, such as slots and rectangles, for example. The holes or patterned features may also be randomly dispersed in the center pad area 22.

Figure 5:
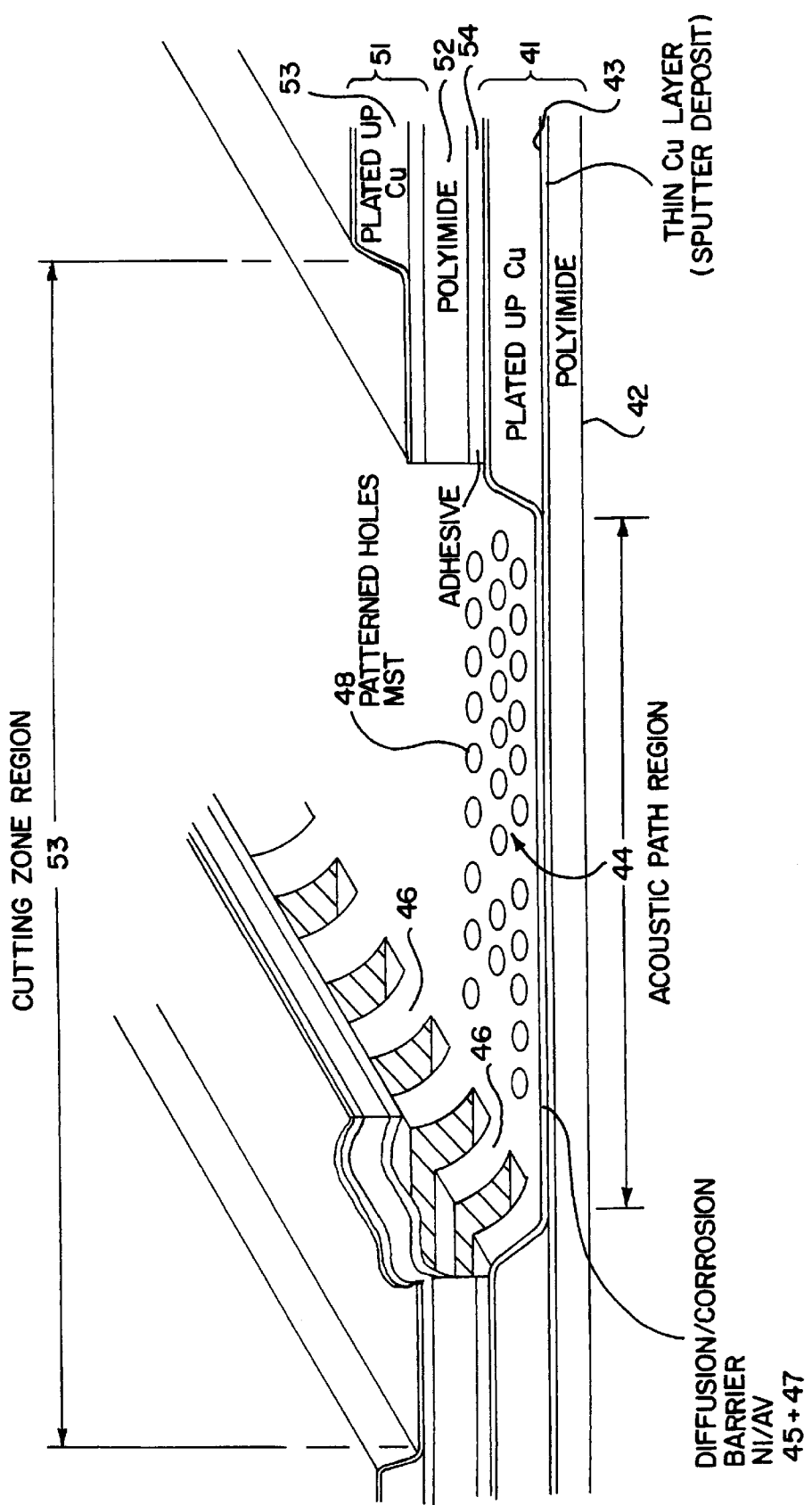
FIG. 5 is a sketch of a portion of a flex circuit interconnect including the acoustic path region according to a preferred embodiment of the present invention.

FIG. 5 is a sketch of a portion of a flex circuit interconnect including the acoustic path region 40 according to a preferred embodiment of the present invention. First the structure of the flex circuit will be described followed by a description of the method of making the flex circuit. In this preferred embodiment, there is a signal plane 41 and a ground plane 51 bonded to the signal plane 41 as shown. The signal plane 41 includes a base layer 42, preferably of polyimide, with a conductive layer 43, preferably of copper, disposed thereon. The signal plane 41 has a centerpad area 44 and signal traces 46 extending from both sides of the center pad area 44. The conductive layer 43 is thinner in the center pad area 44 which will form the acoustic region and between signal traces 46 than it is elsewhere. Preferably disposed on the conductive layer 43 is a diffusion barrier layer 45 and corrosion resistant layer 47 preferably of nickel and gold respectively. A plurality of patterned holes 48 are formed in the center pad area 44 as was described with reference to FIG. 4. The ground plane 51 includes a base layer 52, preferably of polyimide, on which is disposed a conductive layer 53, preferably of copper. An opening is formed in the ground plane 51 in the area that will overly the center pad area 44 of the signal plane 41 when the two planes are bonded together. The conductive layer 53 is thinner around the perimeter of the ground plane closest to the opening than it is away from the opening. The ground plane 51 is bonded to the signal plane 42 preferably by an adhesive 54.

The method for making the flex circuit shown in FIG. 5 will now be described with reference to FIGS. 6–9. FIG. 6 is a cross-section of the base material 60 for the flex circuit interconnect according to a preferred embodiment of the present invention. The base material includes a flexible polyimide film 62. This film is preferably about 7.5 to about 25 microns thick depending upon the requirements for the device. The polyimide film must be of the highest quality available such as E. I. DuPont's Type K KAPTON®. It is important that the film provide an unblemished smooth surface, of uniform thickness that is free of physical aberrations such as dents, pimples, dimples, wrinkles, run lines, voids, bubbles, porosity, pinholes, scratches, etc. that extend from the surface or extend below the surface of the film. In addition to the film must be fabricated in an environmentally controlled Class 10,000 or better clean room.

The film 62 is then metallized to produce a conductive and etchable layer on the surface or surfaces of the film 62. While the preferred embodiment illustrated in FIG. 6 shows both surfaces of the film metallized, only one surface may be metallized depending upon the application to which the flex circuit will be put. This metallization layer must have exceptional adhesion to the surface of the polyimide film 62. The adhesion must be capable of surviving thermal excursions standard to flex circuit lamination techniques. The adhesion must additionally be capable of withstanding chemical attack, such as is normal to methods of circuit manufacturing such as plating, including soft gold plating, cleaning, copper etching and photolithographic techniques. The metallized coating must be able to withstand the mechanical stresses normal to the handling required for standard flexible circuit processing.

In order to prepare the film for metallization, it is first prepared and cleaned using methods standard to vacuum metallization. Techniques include but are not limited to a vacuum preheat (up to 150° C.), corona discharge, glow discharge, RF etching and ion bombardment by an ion beam source. The gasses used for the cleaning process are preferably at an operating pressure in the range of about 0.1 milliTorr to about 100 milliTorr (including the prebake process). Following the cleaning steps a reactive thin film adhesion layer 64 is sputtered on to the film 62. This layer 64 may be titanium, chromium, nickel, titanium/tungsten alloy, monel, inconel or another nickel/copper alloy. This reactive thin film adhesion layer 64 is preferably about 100 to about 500 Angstroms thick. The sputtering process is performed preferably at an operating pressure of about 5 to about 20 milliTorr.

Next a copper layer 66 is preferably sputter deposited on the thin film adhesion layer 64 layer. Preferably the copper layer 66 is deposited to a thickness of about 2000 to about 8000 Angstroms. If required for the particular low mass circuit interconnect, an additional layer of copper 68 may be electrolytically plated to the sputtered metal layer 64. This plated layer 68 may be about 2 to about 10 microns thick and may be composed of alloys at its surface so as to improve the surface roughness of the layer 68. Standard flex circuit plating techniques may be used: anode type and placement, cathode type and placement, shield type and placement, agitation type and placement and racking methods. The techniques are finely adjusted to deliver the high level of plating control that is capable of delivering the required uniformity.

Table 1 describes the copper plating parameters that were used to plate the copper layer 66 with an additional copper layer 68.

TABLE 1

| Description | Range |
| --- | --- |
| Copper | 9–11 oz./gal. |
| Sulfuric Acid | 22–27 oz./gal. |
| Chlorides | 30–80 parts per million |
| Filtration | 8–12 turnovers/hr |
| Aeration | Dry Nitrogen |
| Temperature | 68–70° F. |
| Brightener | 0.4–0.6% |

TABLE 1-continued

| Description | Range |
| --- | --- |
| Carrier | 0.4–0.6% |
| Anode-Cathode distance | 6–12 inches |
| Anode baskets | Titanium |
| Anodes | 1" dia. Hi-Phos copper rounds |
| Cathode Bars | Copper |
| Agitation | 90 degrees to anode cathode |
| Plating Shield | Variable placement Perforated Shield |
| Rack | Custom designed thin flex plating rack |

The base material 60 is then cleaned to remove contaminants and oxidation from its metal surface(s). The cleaning takes place in a combination of detergents and acids that remove the foreign materials and oxidation providing a clean surface that presents an ideal site for the bonding of a photo-reactive dry film resist. To reduce contamination it is desirable that all processing of the material outside of the processing equipment be performed in a Class 10,000 or better clean room.

When required for a particular operating characteristic of the flex circuit, layers of sputtered metal are placed on both sides of the film using the methods described above as shown in FIG. 6. This additional flexible metallized film may be used as the base for signal carrying, shielding or the ground layer of the low mass flexible interconnect.

In a preferred embodiment the base material 60 was formed according to the following steps. The polyimide layer 62 was cleaned using corona discharge and ion bombardment. Preferably a 200 to 300 Angstrom thick monel reactive thin metal adhesion layer 64 was sputter deposited on film 62. Copper layer 66 was then sputter deposited on layer 64 to a thickness of preferably about 3000 to 3500 Angstroms. Finally, copper layer 68 was electrolytrically plated on layer 66 using the parameters described above in Table 1.

The metallized layer is required to be free of aberrations that extend above or below the surface of the metallized layer. These aberrations include voids or partial voids in the metal layer. These abnormalities may be described as scratches, porosity, pin holes, particulates and splatter. The stress resident in the metallized film should be minimized to produce a minimal amount of curl in the material. This is accomplished by controlling the temperature of the substrate during and following the sputtering process as is well known to those of ordinary skill in the art. This is best determined empirically because as is well known to those of ordinary skill in the art, each batch of polyimide reacts differently.

The signal plane of the flex circuit is now ready to be fabricated. The base material 60 is placed on a specialized plastic carrier (not shown) preferably made from 0.060 Eastar PETG Copolyester 6763 available from the Eastman Chemical of Kingsport, Tenn. The plastic carrier is smooth and clean so as to minimize the reflected damage induced by the carrier. The carrier material must also be selected so as to minimize dimensional changes that may occur and become induced in the base material 60 when it is exposed to chemicals and processes that impart thermal energy to it. The base material 60 is placed on the carrier and trimmed to an easily processable length and width.

Next, a dry film resist is laminated to the base material 60 using a differential pressure laminator and a special filler, preferably a silicone rubber blanket to avoid damaging the traces and the transition to the central pad. To effect the bonding of the dry film to the base material 60 residual moisture is first removed through a vacuum bake process. A dry film photo-resist is then bonded to the copper layer 68 of the base material 60. The resist is exposed with a highly collimated U.V. light source, using a high quality silver halide on stable polyester film or iron oxide on a glass photo tool. This tool is specially compensated to allow for changes in the material through the imaging step because the image on the tool is either expanded or shrunken.

The resist 70 is then developed to reveal a circuit pattern. FIG. 7 is a cross-sectional view of a portion of the flex circuit during the development process. As was described with reference to FIG. 4 an array of tightly spaced circular features 35 is formed in the center pad area of the flex circuit. To aid in the resolution of the smaller features a high temperature water bath may be employed to further the resist stabilization process. This step is followed by the immediate development of the imaged layer in a standard aqueous photosensitive resist development process. The levels of exposure (time, power and intensity) and the development variables were empirically developed to determine the precise levels of each set of variables that allow for the optimum level of resolution required for accurately exposing these features. The photoresist is developed to expose the holes 35. The copper layer in the holes 35 is etched away to create the structure shown in FIG. 7. The control of the copper etching process that follows is critical in producing features of the correct form and size. The chemical and mechanical variables including but not limited to copper content, temperature, baume, Oxidation Reduction Potential (ORP), pressure, speed, orientation and surface preparation are tuned to the substrate and type of feature required (See Table 2).

| Description | Range |
| --- | --- |
| Chemistry | Cupric Chloride (with Cl gas regeneration) |
| Copper Concentration | 18–22 ounces/gallon |
| Muriatic Acid | 0.8–1.2N |
| Oxidation Reduction Potential (ORP) | 550–700 mV |
| Temperature | 120–125 degrees F. |
| Manifold Pressure | 1.5 psi |
| Conveyor Speed | 125 inches per minute |
| Orientation | Down |

Following the etching procedure the photo resist 70 is stripped in a standard high pH solution. The substrate is then cleaned and prepared for photo resist lamination in a similar manner to that described above. The entire substrate is then coated with a similar photo-resist in the manner described above. The mask used is similar to that discussed above, although it has a different pattern, as is the method and level of exposure.

A mask is placed over the photoresist and the photoresist is imaged and developed so that the photoresist cover the center pad area of the flex circuit, a portion of the plated copper layer 68 adjacent to the center pad area, and the area between signal traces that will later be diced through to define the transducer elements.

Next, the exposed areas of the flex circuit are plated with additional copper to form layer 74. The copper plating that follows is similar to that described above. Here the variables are set to allow for a uniform layer 74 of plating to grow on the copper traces such that they do not grow at a significantly greater rate on the edges of the traces than in the center of the traces. The results of this process are most critically viewed using a cross section of the trace following completion of the plating process. FIG. 8 is a cross-sectional view of a portion of the flex circuit during the development process after the plating of layer 74.

Upon completion of the electrolytic plating process and thickness confirmation of the plated copper layer 74 by x-ray fluorescence, the resist in the center pad is removed in a standard high pH solution and the entire circuit in plated with a diffusion barrier layer preferably of nickel 76 to preferably a thickness of about 20 to about 40 microinches followed by a corrosion resistant layer preferable of soft gold 78 to a thickness of about 5 to about 15 microinches.

Referring to FIGS. 5 and 9, the ground plane 51 is constructed in a similar manner as the signal plane 41 although it has a different design. The base material for the ground layer may be the same as the base material for the standard flex circuit interconnect 60, or may be composed of a 0.5 ounce/ft$^2$ of copper adhesivelessly bonded to a 0.5 mil polyimide base. A mask is placed over a region of the conductive layer that will overlie the acoustic path region 44 of the signal plane when the two layers are assembled. Also, a region surrounding the center pad area 44 when the two components are assembled, defined as the cutting zone region 53 (see FIG. 5), is masked. Elevation kerfs will eventually be diced in this cutting zone region 53 to define the individual piezoelements. The unmasked areas of the conductive layer are plated up preferably with copper using the additive plating process as described above. The mask is then removed. An opening is cut out of the ground path layer in a portion of the area that was masked which will overlie the center pad 44 of the signal plane 42 when the two components are assembled.

The signal plane 41 and the ground plane 51 are then assembled together so that the opening in the ground plane 51 is aligned over the acoustic path region 44 formed in the signal plane 41. The two components are preferably bonded to a thin adhesive 54 such as Pyralux LF1500 or LF0100 cast acrylic adhesive commercially available from the DuPont Corporation.

The result is a signal plane having an acoustically thin conductive acoustic path region 44 and thick signal traces 46. The total thickness of the metals in the acoustic path region 44 are substantially constant in thickness and may range from about 1 micron to about 10 microns. The total thickness of the metals in the traces 46 ranges from about 0.9 mils to about 1.2 mils.

In a preferred embodiment the distance between the active electrical layers of the signal and ground planes are maintained at or less than about ⅓ the distance between adjacent signal traces 46 to minimize electrical crosstalk and to provide good EMI shielding. This distance relationship is maintained up to the cutting zone region 53 allowing the shielding to be extended very close to the transducer piezoelements. After the ground plane 51 has been adhered to the signal plane 41 the low mass flex circuit is ready to receive the piezoelectric material.

In an alternate embodiment copper is plated in a pattern over the original plated copper of the base material and then used as an etch resist at that point to define the features. This variation has advantages with respect to the resolution of the fine features.

FIG. 10 is a cross sectional view of a piece or slab of piezoelectric material and a portion of the flex circuit according to a preferred embodiment of the present invention. The slab 100 of piezoelectric material has an electrode 102 on both its top and bottom surfaces. At least one acoustic matching layer 104 is disposed on the top surface of the slab 100. The acoustic matching layer 104 is wider than the slab 100 so that its ends extend past the ends of the slab 100. The surface of the acoustic matching layer 104 that is in contact with the slab 100 is metallized 106. Preferably copper is sputtered onto the acoustic matching layer 104, however, other conductive materials can be used and deposited in many ways, for example, by evaporation. The acoustic matching layer is bonded to the piece of piezoelectric material by epoxy bonding. While only one acoustic matching layer has been illustrated, a plurality of acoustic matching layers may be used.

The assembly of the slab 100 and acoustic matching layer 104 can now be dropped in place in the flex circuit 40 shown in FIG. 5. When the assembly is dropped in place, the bottom electrode 102 of the slab 100 is in contact with the conductive center pad 44 of the signal plane 42 and the metallized ends 106 of the acoustic matching layer 104 are in contact with the conductive portion of the ground plane 51 as illustrated. Thus the assembly of the piezoelectric slab 100 and acoustic matching layer 104 can be simply dropped in place and electrical contact is made with both the signal plane and ground plane. In addition the center pad or acoustic path region 44 is electrically coupled over the entire bottom electrode 102 of the slab 100. The assembly of the slab 100 and acoustic matching layer 104 are then bonded in place preferably by an epoxy bond. While only one acoustic matching layer is illustrated a plurality of acoustic matching layers may be provided. Alternatively, no acoustic layers may be provided.

The transducer piezoelements are then defined by dicing the assembled piece in the elevation direction. Preferably, the flex circuit with the slab of piezoelectric material are mounted on a backing block. Kerfs in the elevation direction between the signal traces are then diced through the ground layer, acoustic matching layer or layers and piezoelectric slab and center pad into a portion of the backing block to electrically isolate each transducer piezoelement as is well known to those of ordinary skill in the art.

The present invention provides many advantages. A redundant electrical path is provided which aids in the fabrication of certain transducer architectures such as geometrically focused PZT structures or composites where breaks in the PZT electrode are common thereby resulting in only partial or no excitation of the transducer piezoelement. Additionally, the termination point for connecting the ground path to the PZT electrode is in very close proximity to the transducer piezoelement thereby providing effective EMI shielding and cross talk reduction from the cable termination to the piezoelements. The ground plane is also maintained at a distance of about ⅓ the distance between adjacent traces in the signal plane relative to the traces of the signal plane to minimize electrical cross-talk and control the impedance of the signal traces.

Moreover, the invention is designed to minimize the total metal in the dicing path thereby minimizing the loading of the dicing blade. This allows efficient dicing which in turn minimizes damage to the piezoelectric elements, the matching layers, and acoustic interfaces. Additionally, the invention provides for a substantially thicker electrical path just outside the acoustic and dicing paths to allow for greater conductance along the electrical paths. This also forms a heat sink to draw away heat from the piezoelements.

Finally, the invention provides for improved adhesion of adhesives to the center pad area by having features defined in the center pad area that increase bonding surface area, form cleats or plugs thereby improving mechanical shear strength, and expose polyimide surfaces to affect epoxy to polyimide bonds. Moreover, these features do not have a deleterious affect on the electrical path integrity, nor do they increase the effective epoxy bond line between the PZT and center pad surface.

FIG. 11 is a cross-sectional view of a flex circuit 110 according to a preferred embodiment of the present invention. The signal path layer 112 includes a conductive layer 114 formed of copper foil, typically ½ ounce weight, bonded to a base layer 116 preferably formed of polyimide. The traces are defined using photolithography and subsequent etching as is well known to those of ordinary skill in the art. The copper layer in the acoustic path area 118 is completely etched away at the time of trace definition.

A thin layer of conductive material 120 is deposited on the acoustic path area 118 and over a portion of the signal traces, as shown, to electrically couple the signal traces to the acoustic path area. Preferably the thin layer 120 may be copper or gold which has been deposited by sputtering or evaporation and has a thickness ranging from about 1 $\mu$m to about 3 $\mu$m. A thin layer of gold is then deposited over the thin conductive layer 120.

The ground plane 122 includes a conductive layer 124 formed of copper foil, typically ½ ounce weight, bonded to a base layer 126 preferably formed of polyimide. An opening is formed where the ground plane will overlie the acoustic path area 118 when the two planes 112 and 122 are assembled together. The signal plane and ground plane are preferably adhered together. A piezoelectric piece such as that shown in FIG. 10 can then be dropped into place and the transducer piezoelements diced.

Figure 12:
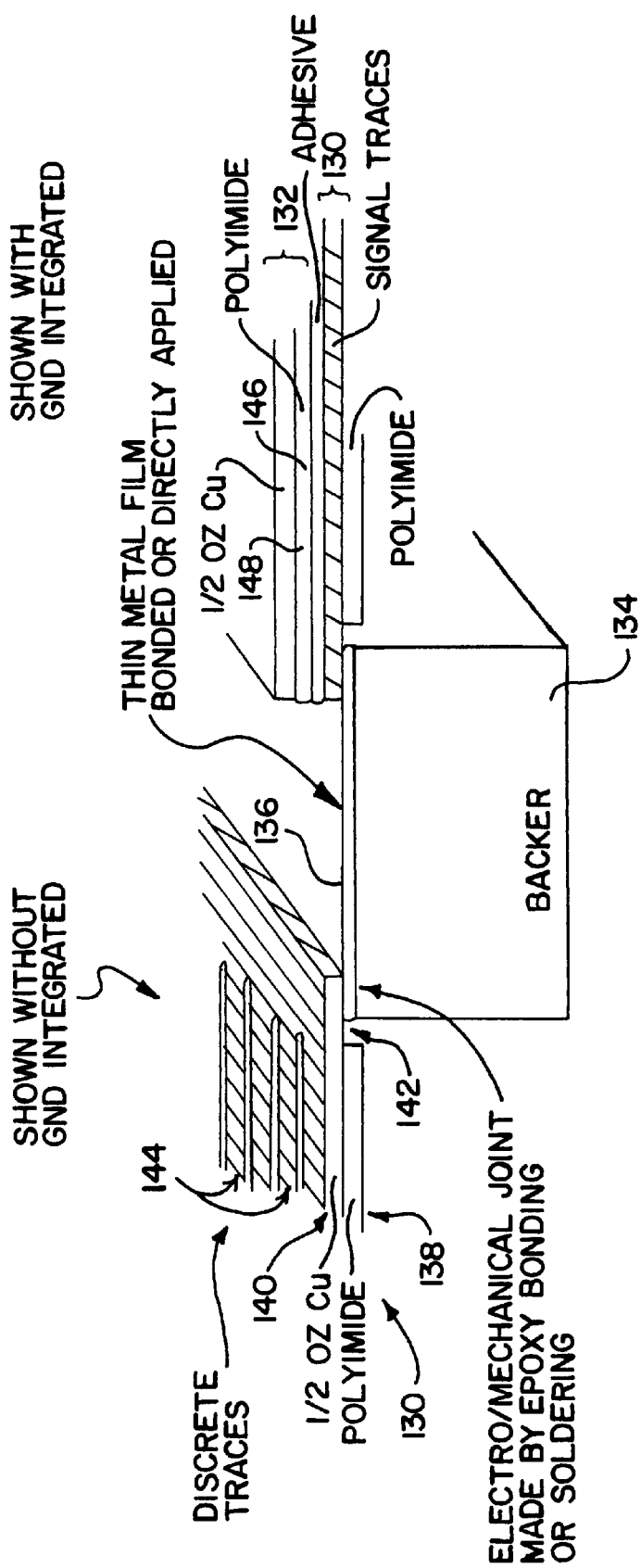
FIG. 12 is a cross-sectional view of a flex circuit according to a preferred embodiment of the present invention.

FIG. 12 is a cross-sectional view of a flex circuit according to a preferred embodiment of the present invention. The left side of the drawing shows only the signal plane 130 while the right side shows the ground plane 132 and the signal plane 130 assembled together. A backing block 134 is provided on which is deposited a thin conductive layer 136. The thin metal film can be either bonded to the backing block or directly applied thereto. Preferably the metal is gold and has a thickness ranging from about 1 $\mu$m to about 10 $\mu$m. The signal plane 130 includes a layer of polyimide 138 on which a relatively thick layer of conductive material 140 is deposited. A portion of the polyimide layer is removed in region 142 as shown. The signal traces 144 are formed by photolithography methods. The signal traces 144 stop short of the acoustic path region.

The ground plane 132 is formed by a relatively thick layer 146 of conductive material deposited preferably on a polyimide layer 148. The ground plane 132 is then bonded to the signal plane 130. The flex circuit is then attached to the backing block 134 by soldering the exposed metal ends of the traces of the signal plane 130 onto the backer. Alternatively, an epoxy may be used. A piezoelectric piece such as that shown in FIG. 10 can then be dropped in place as previously discussed.

FIGS. 13a–c are cross-sectional views of the construction of a flex circuit 150 according to a preferred embodiment of the present invention. FIG. 13a shows a curved backing block 152 with a layer 154 of conductive material such as chrome, copper or gold, for example, deposited thereon and over the sides of the block 152. Next, as shown in FIG. 13b, printed circuit boards 156 or rigid interconnect boards are mounted to the side walls 158 of the backing block 152 by epoxy bonding. The boards 156 are metallized around their top edges and have traces extending down the outer side of the board. The traces can be protected with a plating tape which can be later removed. Next, as shown in FIG. 13c, the metal on the top edges of the board 156 and at the edges of the backing block 152 can be plated up. This will create a metal bridge at the board 156 and backing block 152 interface.

FIG. 14 is a cross-sectional view of a flex circuit 160 according to a preferred embodiment of the present invention. In this preferred embodiment, a traditional flex circuit 162 is used and the acoustic path area 164 is thinned by selective removal, for example, chemical etching, of the conductive material. All other process steps remain the same.

FIG. 15 is a cross-sectional view of a flex circuit 170 according to a preferred embodiment of the present invention. In this preferred embodiment, a traditional flex circuit 172 is used. The center pad or acoustic path area is removed and replaced by a separate polymer film 174 with a thin conductive layer 176 which is bonded to the thicker flex circuit. The conductive layer is preferably selected from the group, gold, aluminum or copper.

In summary, the present invention provides a connection means that has a low mass in the acoustic region, provides a redundant electrode and has substantially thinner conductive layers in the acoustic path and thicker conductors outside the acoustic path to minimize resistance compared to constant foil thickness or prior art flexible circuits such as that described in U.S. Pat. No. 4,404,489.

A low mass connection is accomplished in a form that permits mass termination of the piezoelement connections, and allows non-destructive connection methods (epoxy bonding or directly deposited versus soldering, welding, thermocompression) as compared to individually terminated connections required by wire bonding, TAB and hand soldering. It permits a low mass connection to be made with minimal non-active elevational piezoelement length or intermediate connectors thereby allowing a smaller transducer footprint. Soldering, welding, and thermocompression attachments are also possible with the invention, particularly at the ground path connection sites.

The present invention also has an integral ground plane having a connection site in very close proximity to the piezoelements. The metal thickness in the cutting zone of the ground plane is thinned to reduce dicing blade loading while outside the cutting zone the thickness is increased to minimize electrical resistance. The ground plane is maintained relative to the signal plane at a distance of less than about 1/3 the distance between adjacent signal traces to minimize electrical crosstalk and control the impedance of the signal traces. Additionally, the invention provides a means for improving the adhesive bond strength between the epoxy and the acoustic path region via patterned features in the center pad area of the flex circuit. Finally, the additive plating process used in fabrication of the above described preferred embodiments, permits substantially finer trace geometry and higher aspect-ratio traces and a means for achieving low mass loading at the piezoelement connection sites over the methods used in fabrication of the prior art circuits such as subtractive etching.

It is to be understood that the forms of the invention described herein are to be taken as preferred examples and that various changes in the shape, size and arrangement of parts may be resorted to, without departing from the spirit of the invention or scope of the claims.

What is claimed is:

1. A low mass flexible circuit for an ultrasound transducer, the flexible circuit comprising:
 a layer of non-piezoelectric material;
 a layer of conductive material disposed on the layer of non-piezoelectric material, the conductive material having a first thickness in an acoustic path area and a second thickness in at least one trace area, wherein the at least one trace area is coupled to the acoustic path area and the first thickness of the conductive material in the acoustic path area is less than the second thickness of the conductive material in the at least one trace area;
 a ceramic piezoelectric crystal having an electrode on a surface wherein the crystal is deposited on the acoustic path area so that the electrode formed on the crystal is electrically coupled to the layer of conductive material in the acoustic path area; and
 textured features defined in the acoustic path area to enhance adhesion to the ceramic piezoelectric crystal.

2. A low mass flexible circuit for an ultrasound transducer system, the flexible circuit comprising:
 a signal path layer having a center pad area and electrical trace areas leading away from the center pad area wherein the thickness of the center pad area is thinner than the thickness of the trace areas; and
 a ground path layer disposed on the signal path layer, the ground path layer having a base film in contact with the signal path layer and conductive material disposed on the base film, the ground path layer having an opening over the center pad area of the signal path layer.

3. A low mass flexible circuit according to claim 2 further comprising a diffusion barrier layer on the conductive material of the ground path layer and the center pad area of the signal path layer.

4. A low mass flexible circuit according to claim 3 further comprising a corrosion resistant layer on the conductive material of the ground path layer and the center pad area of the signal path layer.

5. A low mass flexible circuit according to claim 2 wherein the ground path layer is coupled to the signal path layer by an adhesive.

6. A low mass flexible circuit according to claim 2 wherein the thickness of the center pad area ranges from about 1 micron to about 3 microns.

7. A low mass flexible circuit according to claim 2 wherein the conductive material is copper.

8. A low mass flexible circuit according to claim 2 wherein the conductive material is nickel.

9. A low mass flexible circuit according to claim 2 wherein the conductive material is gold.

10. A low mass flexible circuit according to claim 3 wherein the diffusion barrier layer is about 20 $\mu$m in. thick.

11. A low mass flexible circuit according to claim 4 wherein the corrosion resistant layer is about 20 $\mu$m in. thick.

12. A low mass flexible circuit according to claim 2 wherein the signal path layer is constructed on a base film having a conductive material applied to one surface.

13. A low mass flexible circuit according to claim 2 wherein the conductive material has a thickness of about 3000 Å.

14. A low mass flexible circuit according to claim 2 wherein the base film is a polymer.

15. A low mass flexible circuit according to claim 2 wherein the distance separating the ground path layer from the signal path layer ranges from about 0.7 mils to about 1 mil.

16. A low mass flexible circuit according to claim 2 wherein the conductive material of the ground path layer terminates close to the center pad area of the signal path layer.

17. A low mass flexible circuit according to claim 2 wherein the conductive material of the ground path layer is arranged to control the impedance of the traces in the signal path layer.

* * * * *

UNITED STATES PATENT AND TRADEMARK OFFICE
CERTIFICATE OF CORRECTION

PATENT NO. : 5,923,115
DATED : July 13, 1999
INVENTOR(S) : John P. Mohr, III et al.   Page 1 of 2

It is certified that error appears in the above-identified patent and that said Letters Patent is hereby corrected as shown below:

On the Title Page

In column 1, item [54], please change the title to read:
--FLEXIBLE CIRCUIT INTERCONNECT--.

In column 1, please change the title to read:
--FLEXIBLE CIRCUIT INTERCONNECT--.

In column 6, line 50, please change "overly" to
--overlay--.

In column 7, line 4, please delete "to".

In column 7, line 40, please delete "layer" (second occurrence).

In column 8, line 36, please change "electrolytrically" to --electrolytically--.

In column 9, before table 2, please insert --TABLE 2-- (centered).

UNITED STATES PATENT AND TRADEMARK OFFICE
CERTIFICATE OF CORRECTION

PATENT NO. : 5,923,115
DATED : July 13, 1999
INVENTOR(S) : John P. Mohr, III et al.

It is certified that error appears in the above-identified patent and that said Letters Patent is hereby corrected as shown below:

In column 9, table 2, line 3 up from the end of the table, please change "1.5" to --15--.

In column 9, line 54, please change "cover" to --covers--.

In column 10, line 6, please change "in" to --is--.

In column 10, line 36, please change "to a thin adhesive 54 such as Pyralux LF1500" to --together using a thin adhesive 54 such as Pyralux LF150--.

Signed and Sealed this

Twenty-sixth Day of December, 2000

Q. TODD DICKINSON

*Attest:*

*Attesting Officer*       *Director of Patents and Trademarks*